United States Patent [19]

Inoue et al.

[11] Patent Number: 5,098,742
[45] Date of Patent: Mar. 24, 1992

[54] METHOD FOR SUPPLYING VACUUM EVAPORATION MATERIAL

[75] Inventors: Isamu Inoue, Hirozo Takegawa, Ryutarou Akutagawa, Kayoko Kodama, Hidenobu Shintaku, all of Osaka, Japan

[73] Assignee: Matsushita Electric Industrial Co., Ltd., Osaka, Japan

[21] Appl. No.: 539,740

[22] Filed: Jun. 18, 1990

[30] Foreign Application Priority Data

Jun. 19, 1989 [JP] Japan .................................. 1-156520
Mar. 22, 1990 [JP] Japan .................................. 2-075218

[51] Int. Cl.$^5$ .................................................. C23C 16/00
[52] U.S. Cl. .................. 427/248.1; 427/250; 427/255.2; 427/294
[58] Field of Search ............. 427/248.1, 250, 255.2, 427/294

[56] References Cited

FOREIGN PATENT DOCUMENTS 63-000460 1/1988 Japan .
1122577 8/1968 United Kingdom .

Primary Examiner—Bernard Pianalto
Attorney, Agent, or Firm—Wenderoth, Lind & Ponack

[57] ABSTRACT

A method for supplying a vacuum evaporation material provides a first vacuum evaporation material accommodated in a crucible and heated by electron beams so as to be fused. When a thin film is formed by adhering vapor generated form the first material to a substrate, a second long supply vacuum evaporation material is fed in a positive direction, the second material moving from above a liquid surface of the first material toward the first material which has fused in the crucible. An average feed speed of the second material is maintained by alternately switching a feed direction between the positive direction and the negative direction, in which the second material moves backward. An apparatus for supplying the vacuum evaporation material in which the first material is supplied to the crucible by alternately switching the feed direction between the positive and the negative directions, includes an operating circuit for performing the following calculation based on an instruction of an average supply speed ($V_{AV}$) for feeding the second material:

$$(V_{AV}) = (F - B)/(T_{FD} + T_{BD} + T_{FS} + T_{BS}).$$

F is a feed amount in the positive direction, B is a feed amount in the negative direction (constant), B > 0; $T_{FD}$: net feed period of time in the positive direction, $T_{FS}$ is a suspension period of time in the positive direction feed, $T_{FS} \geq 0$. $T_{BD}$ is a net feed period of time in the negative direction (constant), and $T_{BS}$ is a suspension period of time in the negative direction feed (constant), $T_{BS} \geq 0$. A driving circuit drives the second material according to each calculated value calculated by the operating circuit.

16 Claims, 14 Drawing Sheets

CONDITION (a)

CONDITION (b)

CONDITION (c)

CONDITION (d)

$K_1 = D/\sin \theta_1$

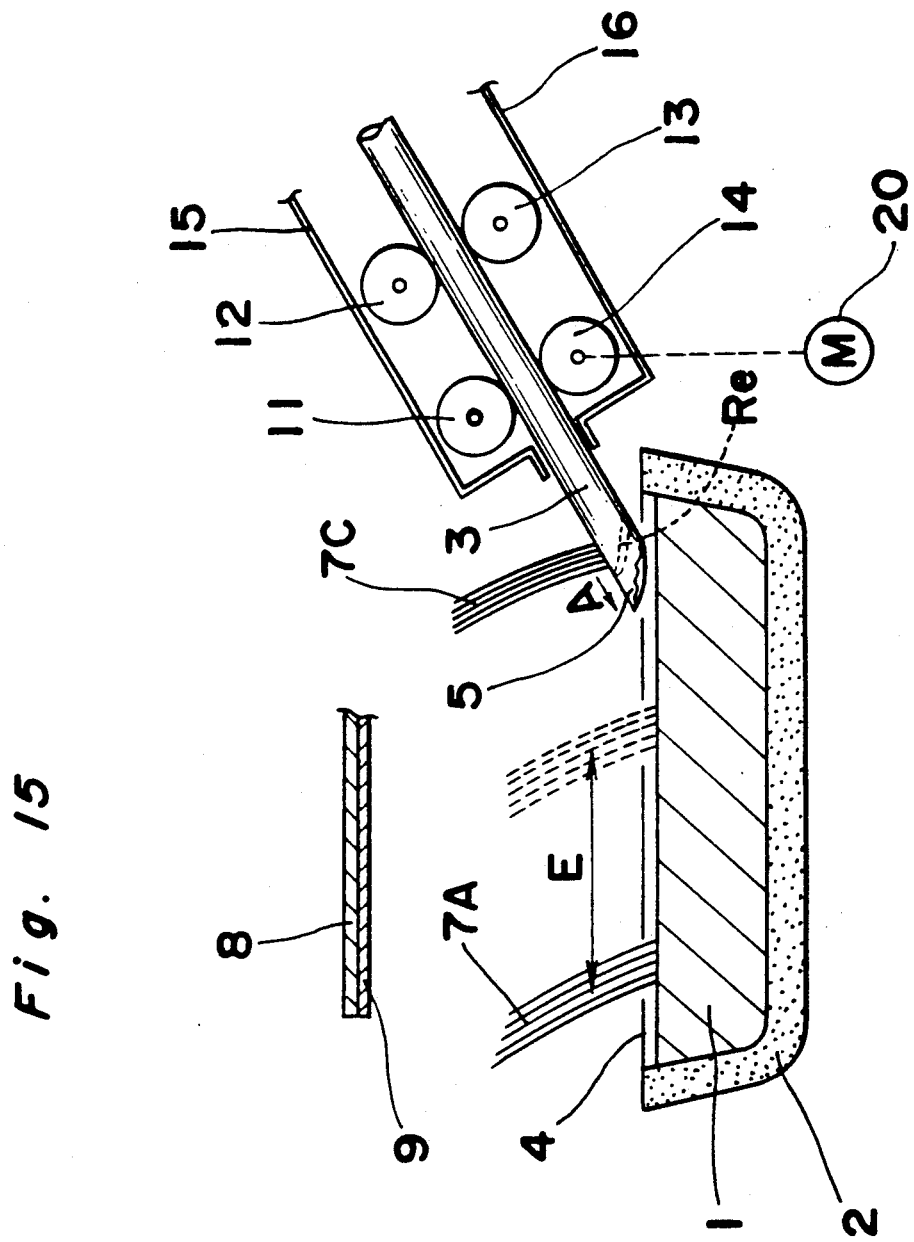

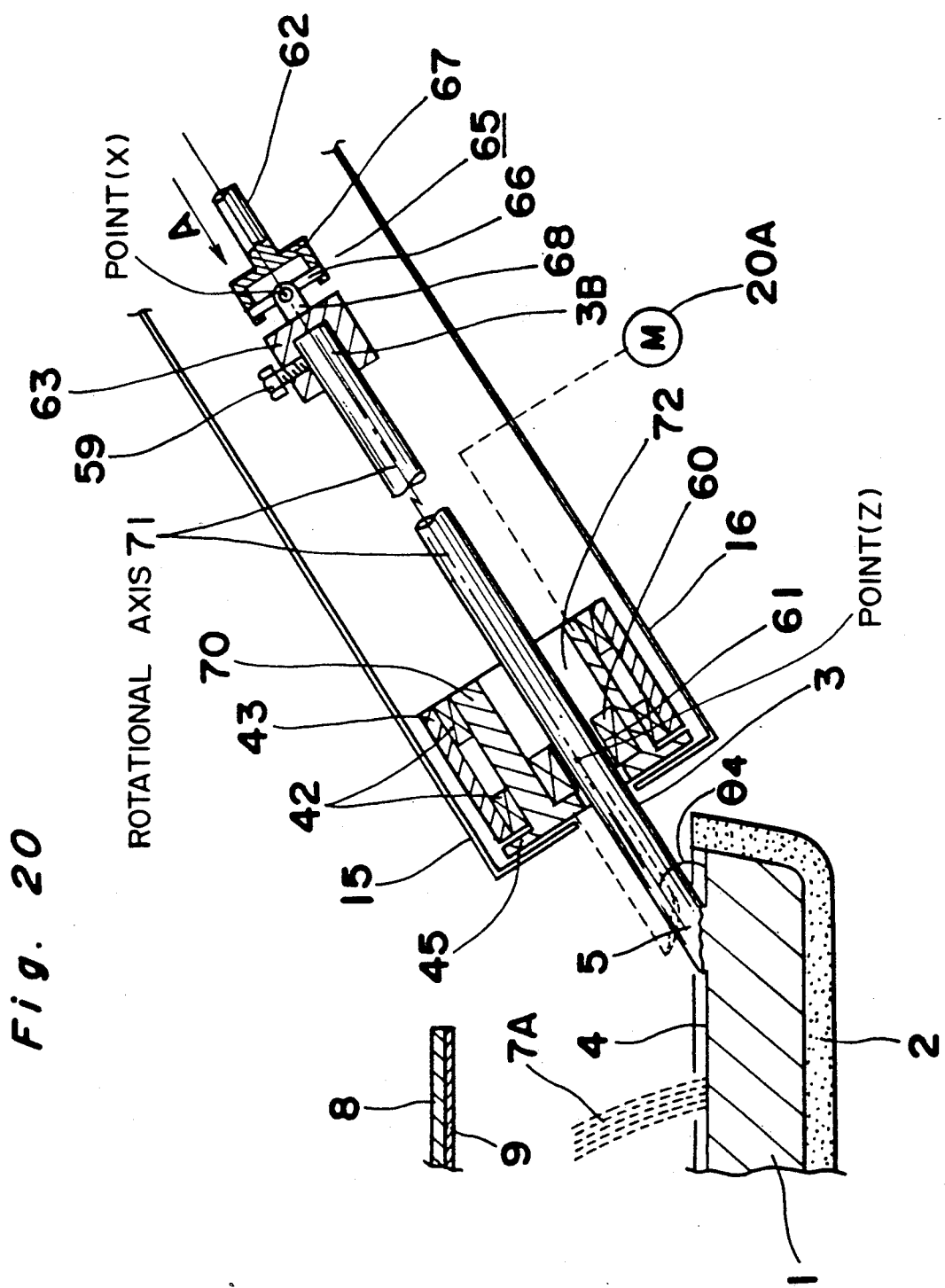

5,098,742

METHOD FOR SUPPLYING VACUUM EVAPORATION MATERIAL

BACKGROUND OF THE INVENTION

The present invention relates to a method for supplying a vacuum evaporation material to a position to be heated in forming a thin film on a substrate.

In order to form a thin film on a long film and manufacture a functional film serving as the material of a capacitor, a magnetic tape or the like by means of vacuum evaporation, it is necessary to generate a large quantity of vapor over a long period of time. To this end, it is necessary to successively supply a vacuum evaporation material to a position to be heated where a member such as an evaporation crucible is located.

Conventionally, several methods as shown below have been used to successively supply a vacuum evaporation material.

According to the first method, as shown in "Thin Film Handbook" (published by Ohm Publishing Co., Ltd. in 1983, page 105) edited by Japan Science Promotion Association, a vacuum evaporation material in the form of a wire is supplied to a crucible.

This method is applicable to a vacuum evaporation material of a ductile material such as Al, Ni, or Cu which can be easily formed into a wire. But this method has a problem in that it is very difficult to form a brittle material such as Cr into a wire. In addition, a rigid material such as a material of a magnetic film, for example an alloy of Co-Cr or an alloy of Co-Cr-Ni, is not brittle and could be formed into a wire, but cannot be easily processed, so that the manufacturing cost is high and not of practical use.

According to the second method, the brittle and rigid materials as described above are supplied in the form of a bar.

The problem with the supply of a vacuum evaporation material in the form of a bar is described using FIGS. 1 through 7. In FIG. 1, reference numeral 1 denotes a vacuum evaporation material, accommodated in a crucible 2, which is heated by electron beams scanned in the direction, for example, shown by the arrow (E) and fuses. Reference numeral 3 designates a bar-shaped long supply vacuum evaporation material, (hereinafter referred to as bar material) 11, 12, 13 denote rollers for guiding the bar material 3, and 14 denotes a driving roller. A motor 20 is installed either in a vacuum chamber (not shown), thus directly driving the driving roller 14 or on the outside, thus driving the driving roller 14 through a known rotation transmitting unit. The driving roller 14 is driven by the motor 20 in CCW direction, and the driving roller 14 and the rotation roller 11 sandwich the bar material 3 therebetween, the driving roller 14 thus feeding the bar material 3 in the direction shown by the arrow (A) at a constant speed from above the liquid surface 4 toward the liquid surface 4 of the vacuum evaporation material 1, which has fused. Reference numerals 15 and 16 denote covers for preventing the vapor of the vacuum evaporation material 1 from adhering to the rollers 11, 12, 13, and 14.

In order to form a thin film 9 on a substrate 8 positioned above the crucible 2 over a long period of time by the above construction, the bar material 3 is supplied to supplement a vaporization-reduced amount of the vacuum evaporation material 1 accommodated in the crucible 2.

The behavior of the end 5 of the bar material 3 which takes place after the end 5 contacts the liquid surface 4 is described based on FIGS. 2 through 5. FIG. 2 is a view showing the end 5 of the bar material 3, which has just contacted the liquid surface 4, and this condition is supposed to be condition (a). In this condition (a), the end 5 starts melting as a result of heat absorption from the liquid surface 4, thus fusing into a solution 6 of the vacuum evaporation material 1 as shown by the arrow (R) of condition (b) of FIG. 3. At this time, heat is transmitted to the end 5 in the direction opposite to the direction shown by the arrow (R), and consequently the fusion of the end 5 progresses. With the progress of the fusion, the distance (g) between the liquid surface 4 and the end 5 of the bar material 3 becomes long, so that it becomes difficult for heat to be transmitted from the liquid surface 4 to the end 5. As a result, the fusion amount of the end 5 is reduced as shown by condition (c) of FIG. 4, and the amount of the solution 6 becomes small. Consequently, it becomes more difficult for the end 5 to melt, with the result that the fusion stops as shown by condition (d) of FIG. 14. The bulge of the end 5 of FIG. 5 is a droplet 6A of the solution 6.

Meanwhile, the bar material 3 is continuously fed in the direction shown by the arrow (A), but the fusion speed of the end 5 from the condition (a) until the condition (d) is faster than the bar material feeding speed. Therefore, a gap (D) is formed as shown by the condition (d). Since the bar material 3 is continuously fed, the gap (D) becomes small with the elapse of time, thus resulting in the condition (a). Thus, this cycle is repeated. That is, although the bar material 3 is continuously fed, the bar material 3 is intermittently fed to the liquid surface 4.

While the end 5 is fusing with the liquid surface, the end 5 absorbs heat from the liquid surface 4, so that the temperature of the liquid surface 4 lowers. As a result, the evaporation speed lowers and the evaporation speed cyclically fluctuates with the elapse of time, as shown in FIG. 6. The distance (D) of the condition (d) becomes great as the diameter of the bar material 3 becomes large. The reason is that, supposing that the configuration of the solution 6 is substantially a cylinder, as the diameter of the cylinder becomes large, the ratio of surface area of cylinder to volume of cylinder becomes small. Therefore, the ratio of heat quantity which escapes from the surface of the cylinder by radiation to the heat quantity which is transmitted from the liquid surface 4 to the top end 5 through the solution 6 becomes small, so that it takes long for the end 5 to fuse. Accordingly, when the diameter of the bar material becomes large, both the cycle $T_L$ and fluctuation width $H_L$ of the evaporation speed shown in FIG. 6 become large.

This method has a problem in that due to the fluctuation of the evaporation speed, the film thickness is not uniformly formed in the direction in which vacuum evaporation is carried out while a substrate 8, such as a film, is moving above the crucible 2, forming a film while the substrate 8 is moving.

In order to overcome the above-described problem, according to the third method shown in FIG. 7, the bar material is supplied to the crucible after it is fused. This method is described using the reference numerals of FIG. 1 concerning the same parts of FIG. 7. In FIG. 7, electron beams 7B for fusing the bar material are irradiated onto the end 5 of the bar material 3 to fuse, and unlike the second method, the temperature of the liquid surface 4 is not lowered by the supply of the solution 6 to the liquid surface 4, so that the evaporation speed does not fluctuate. Accordingly, if a film is formed by traveling the substrate 8 above the crucible 2 in a direction perpendicular to the sheet surface of FIG. 7, the film thickness of a thin film 9 does not become nonuniform.

Next, a description is made with regard to a condition for constantly maintaining the composition ratio of an alloyed thin film formed on a substrate when the vacuum evaporation material 1 consists of an alloy of Co-Cr, which is a material, such as a magnetic material, composed of components different in evaporation speeds. The evaporation speed of Cr is faster than that of Co by three to four times, so that supposing that the content of Cr of a thin film to be formed is (M) and the content of Cr of a thin film material 1 is (Y), it is required that M is 3 to 4 times more than Y, that is, $M = (3 \sim 4)Y$. The content of Cr of vapor generated from the liquid surface 4 is equal to (M). Accordingly, if a material with Cr content of (M) and equal to an evaporated amount can be supplied, a thin film with Cr content of (M) can be continuously formed with the amount of the thin film material 1 in the crucible 2 kept to be constant.

However, in the construction of FIG. 7, the solution 6 formed by the irradiation of the electron beams 7B onto the end 5 of the bar material 3, with a Cr content of (M), stays at the end 5 of the bar material 3 by its surface tension, thus becoming a large droplet 6B. Thereafter, the droplet 6B does not become resistant to the gravity, thus falling to the liquid surface 4. The solution 6 falls in one droplet 6C or in two droplets 6C when the droplet 6C which stays on the end 5 of the bar material 3 becomes too great. Supposing that the diameter of the bar material is Db, in terms of the length of the bar material, the volume of the droplet 6C is Db/15 when the droplet 6C is small or the volume of a column corresponding to Db/3 when the solution falls in two droplets 6C. Thus, when such a large quantity of droplet 6C with Cr content of (M) falls to the liquid surface 4, the density of Cr on the liquid surface 4 becomes high and the Cr content in vapor generated from the liquid surface 4 becomes greater than (M). This method has a problem in that the composition ratio among components of an alloyed thin film fluctuates in the travel direction of a substrate in forming a thin film by traveling the substrate above the crucible because the droplet 6C falls intermittently.

SUMMARY OF THE INVENTION

Accordingly, an essential object of the present invention is to resolve the problems described above and to provide a novel method for supplying a vacuum evaporation material and an apparatus therefor.

In accomplishing this and other objects, according to one aspect of the present invention, there is provided a method for supplying a vacuum evaporation material, in which a first vacuum evaporation material accommodated in a crucible is heated to be fused, and when a thin film is formed by adhering vapor generated from the first material to a substrate, a second vacuum evaporation material, which is long, is fed in a positive direction on an average of feed speed of the second material by alternately switching a feed direction thereof between the positive direction and a negative direction, supposing that a direction in which the second material moves from above the liquid surface toward the first material which has fused in the crucible is the positive direction and a direction in which the second material moves backward therefrom is the negative direction.

According to still another aspect of the present invention, there is provided a method for supplying a vacuum evaporation material, comprising the steps of:

a vacuum evaporation material feed means for feeding a second vacuum evaporation material, which is long, in a condition in which the second material is fed in a positive direction on an average of feed speed of the second material by alternately switching a feed direction thereof between the positive direction and a negative direction, supposing that a direction in which the second material moves from above the liquid surface toward a liquid surface of a first vacuum evaporation material which has fused in a crucible is the positive direction and a direction in which the second material moves backward therefrom is the negative direction; and changing the temperature of the vicinity of an end of the second material being fed toward the liquid surface.

According to a further aspect of the present invention, there is provided a method for supplying a vacuum evaporation material, in which in forming a thin film by heating and melting a first vacuum evaporation material accommodated in a crucible and adhering vapor generated from the first material to a substrate, an angle formed by a liquid surface of the first material with respect to a feed direction in which a second vacuum evaporation material, which is long, is fed from above the liquid surface toward the liquid surface is different from 90° and the second material is rotated around an axis thereof or around an axis a predetermined distance offset from the axis thereof.

According to a still further aspect of the present invention, there is provided a method for supplying a vacuum evaporation material in which in forming a thin film by heating and melting a first vacuum evaporation material accommodated in a crucible and adhering vapor generated from the first material to a substrate, a crank mechanism is fed from above the liquid surface toward a liquid surface of the first material accommodated in the crucible while the crank mechanism causes a second vacuum evaporation material, which is long, to make a reciprocating motion of moving toward the first material which has fused in the crucible and moving away from the first material.

BRIEF DESCRIPTION OF THE DRAWINGS

These and other objects and features of the present invention will become clear from the following description taken in conjunction with the preferred embodiments thereof with reference to the accompanying drawings, in which:

FIG. 15 is a schematic construction view, partly in section, showing an apparatus for supplying a vacuum evaporation material according to a fourth embodiment of the present invention;

FIG. 20 is a schematic construction view, partly in section, showing a method for supplying a vacuum evaporation material according to a seventh embodiment of the present invention.

BEST MODE FOR CARRYING OUT THE INVENTION

Figure 1:
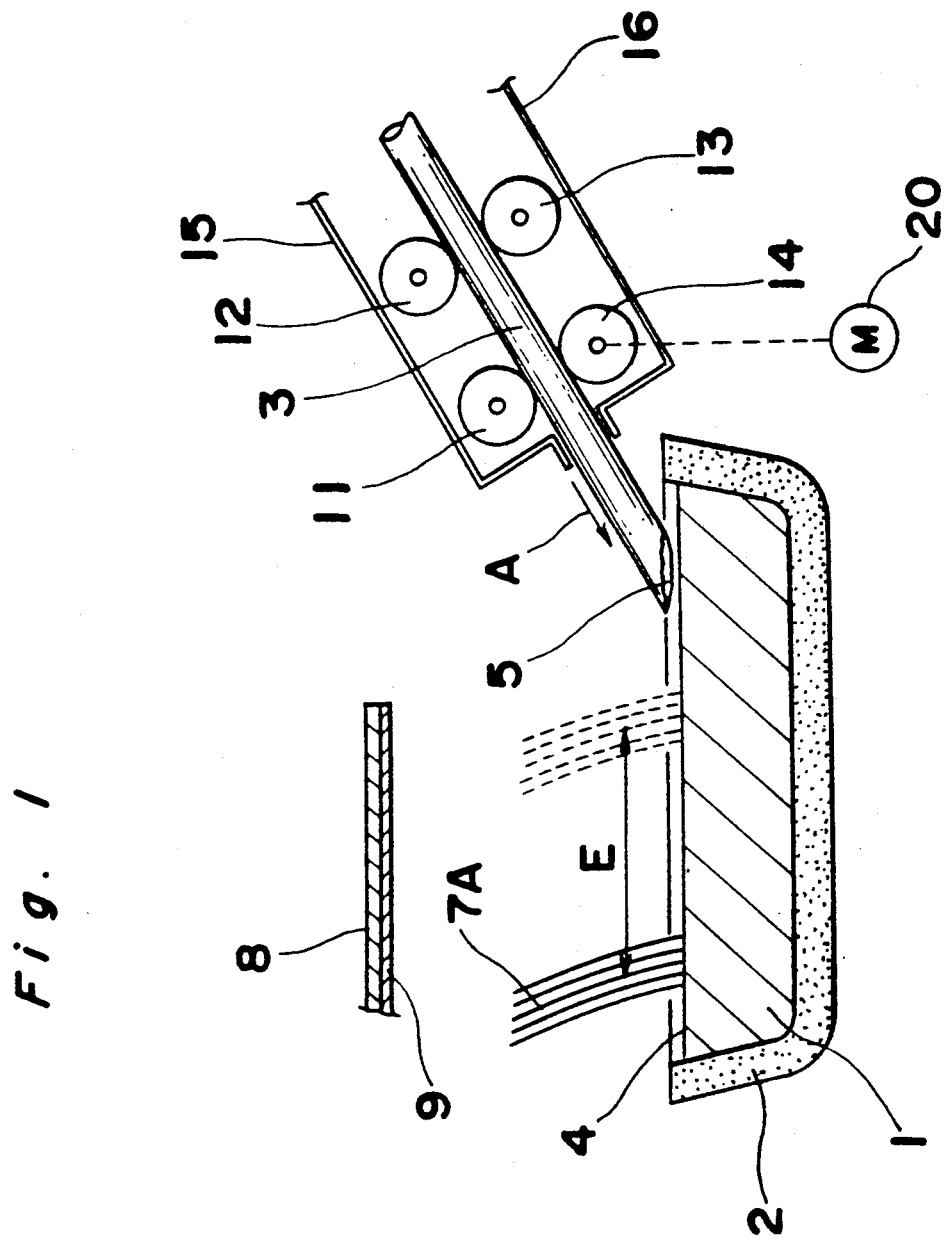
FIG. 1 is a schematic construction view, partly in section, showing a second conventional method for supplying a vacuum evaporation material and an apparatus therefor.

Before the description of the present invention proceeds, it is to be noted that like parts are designated by like reference numerals throughout the accompanying drawings.

Embodiments of the present invention are described. In the illustrations, the same parts as those of the conventional art are denoted by the same reference numerals.

Figure 8:
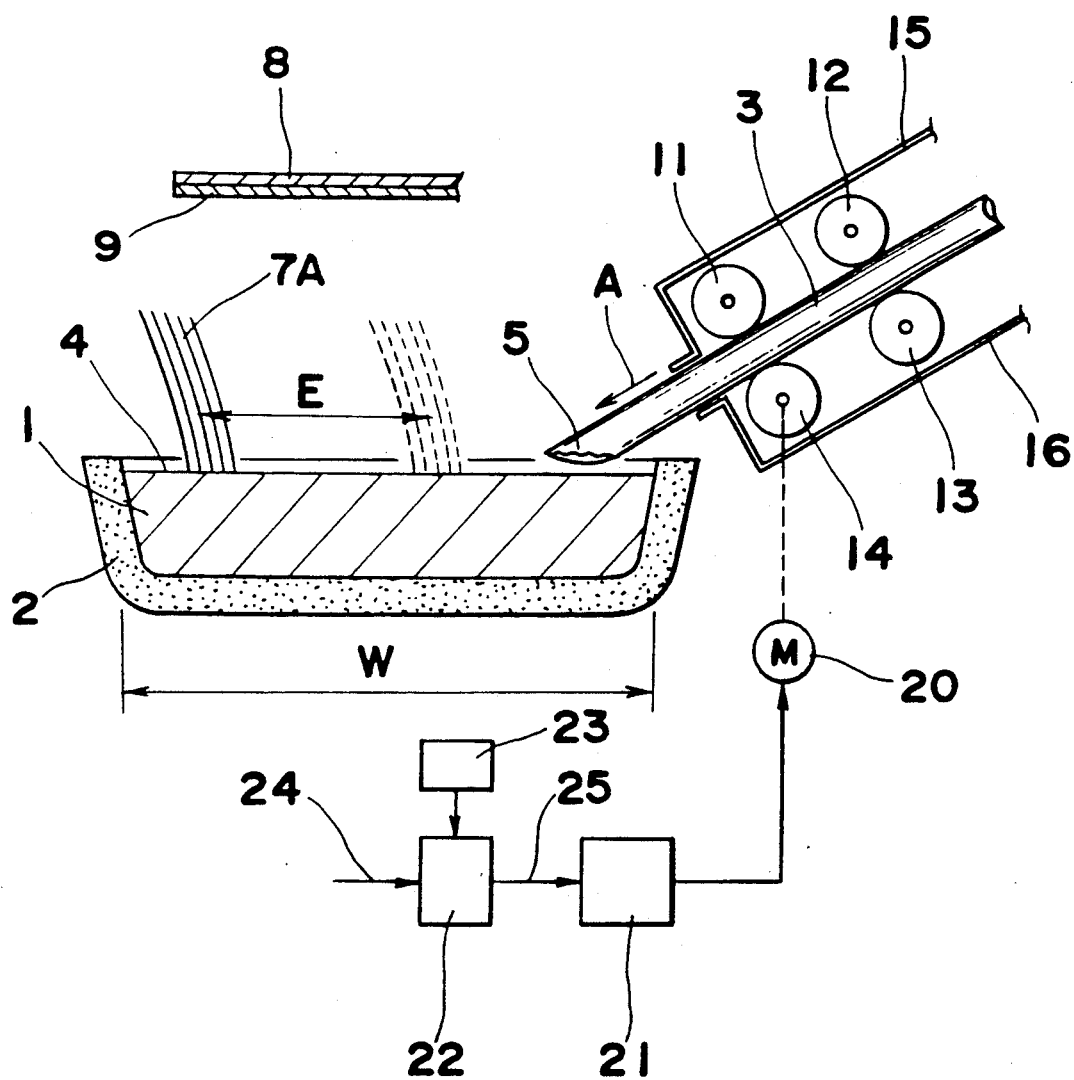
FIG. 8 is a schematic construction view, partly in section, showing a method for supplying a vacuum evaporation material and an apparatus therefor according to a first embodiment of the present invention.

FIGS. 8 through 11 are illustrations of the first embodiment of the present invention. In FIG. 8, reference numeral 20 denotes the motor to be driven by a driving circuit 21, and the motor 20 rotates the driving roller 14. Reference numeral 22 designates an arithmetic circuit for performing an operation of the speed pattern of the motor 20 based on an instruction 24 of the average feed speed $V_{AV}$ of the bar material 3 and data stored in a memory 23, thus outputting the result of the operation to the driving circuit 21 as a speed instruction 25.

Figure 9:
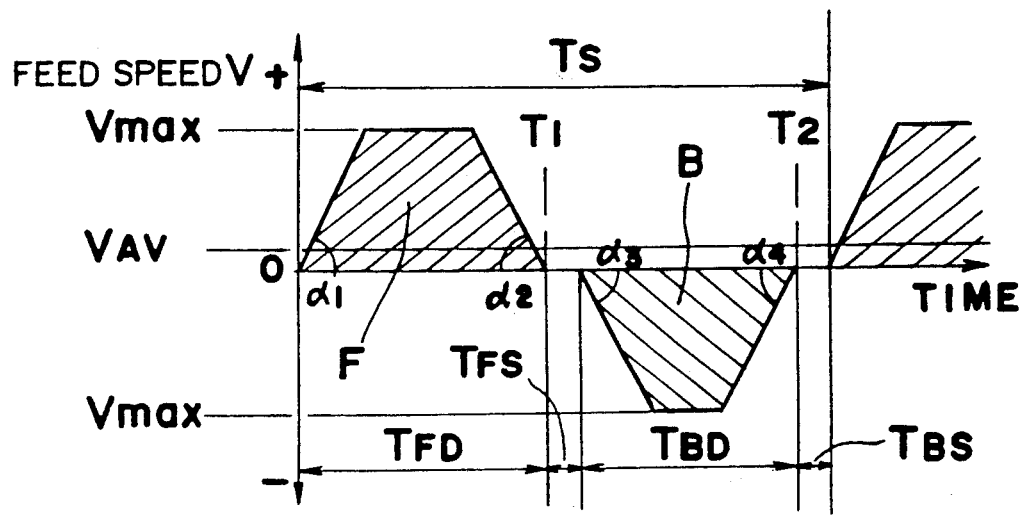
FIG. 9 shows the feed speed pattern of a bar material according to the first embodiment of the present invention.

Next, an example of a speed pattern operation is shown in FIG. 9. In FIG. 9, the feed speed (v) shows the feed speed of the bar material 3 in FIG. 8. Positive (+) designates the speed in the direction shown by the arrow (A) in FIG. 8, and negative (−) indicates the speed in the direction opposite to the direction shown by the arrow (A). The configuration of the speed pattern is a trapezoidal waveform in both the positive and negative directions. In order to simplify the operation, the maximum speed ($V_{MAX}$) is the same in both the positive and negative directions, and the acceleration speed and deceleration speed from 0 until $V_{MAX}$, namely, angles $\alpha_1$, $\alpha_2$, $\alpha_3$, and $\alpha_4$, are identical to each other. Suspension times $T_{FS}$ and $T_{BS}$ are provided so that an excessive force is applied to a bar material supply mechanism comprising rollers and the motor shown in FIG. 8 when the feed speed changes from the positive direction to the negative direction and from the negative direction to the positive direction or provided as necessary period of time for performing the operation, however, suspension time $T_{FS}$ and $T_{BS}$ are not necessarily provided.

The area of the trapezoidal waveform in the positive direction shows the feed distance (F) in the direction shown by the arrow (A). The area of the trapezoidal waveform in the negative direction shows the feed distance (B) in the direction opposite to the direction shown by the arrow (A). $T_{FD}$ and $T_{BD}$ indicate the net feed period of time in the positive direction and the net feed period of time in the negative direction, respectively. In the above, the average feed speed $V_{AV}$ is expressed by an equation (1):

$$V_{AV} = (F-B)/(T_{FD}+T_{BD}+T_{FS}+T_{BS}) \tag{1}$$

$T_{FD}$ can be calculated based on an equation (2):

$$T_{FD} = T_{BD} + [(F-B)/V_{MAX}] \tag{2}$$

$V_{AV}$ is set so that similarly to the known art, the vacuum evaporation material 1 in the crucible 2 cannot be reduced, i.e., an evaporation amount can be supplemented.

Figure 2:
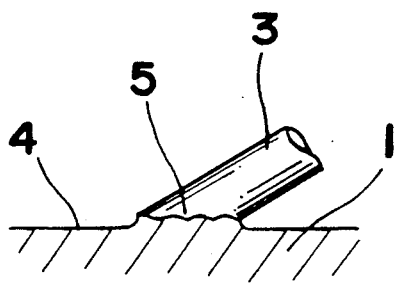
FIGS. 2, 3, 4, and 5 are explanatory enlarged views showing the end of the material and the liquid surface of the solution in FIG. 1.
Figure 3:
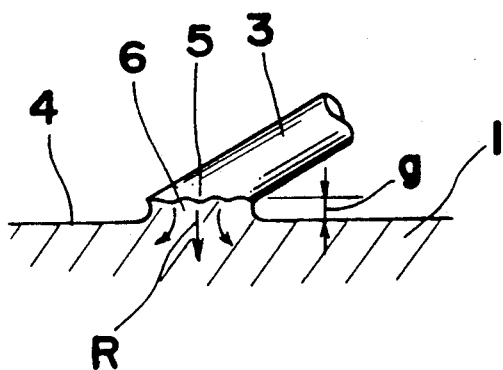
Figure 4:
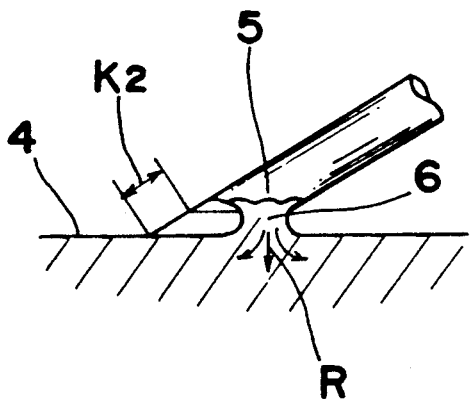
Figure 5:
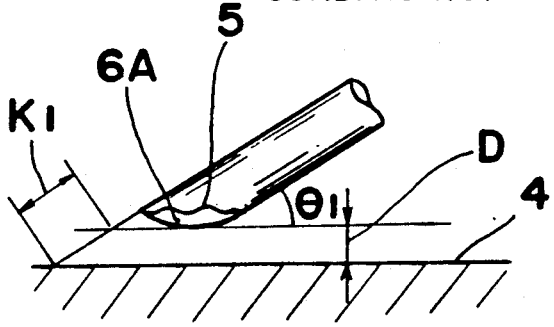
Figure 6:
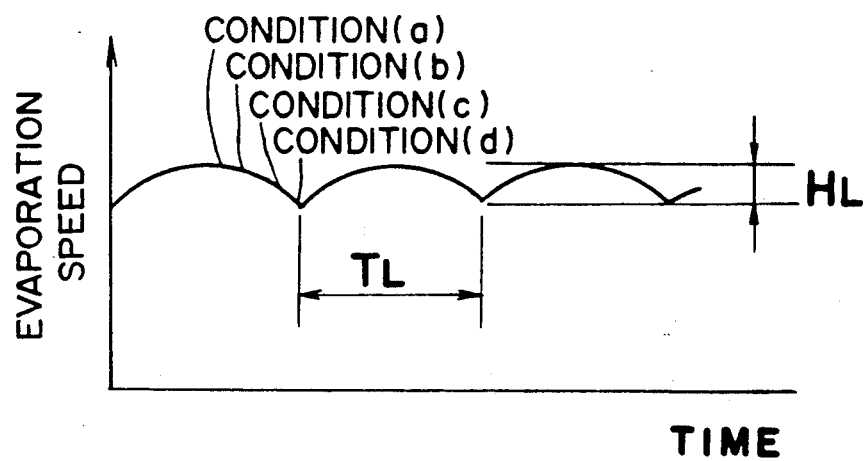
FIG. 6 is a graph showing the fluctuation of an evaporation speed in the second conventional method for supplying a vacuum evaporation material and the apparatus therefor.
Figure 10:
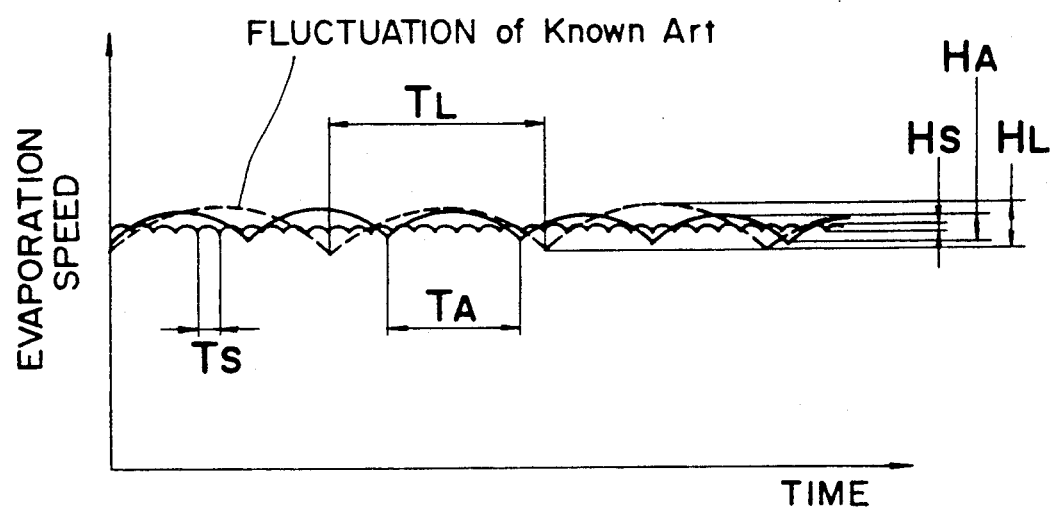
FIG. 10 is a graph showing the fluctuations of the evaporation speeds of the present invention and the conventional method by comparison.

When the bar material 3 is driven in the speed pattern shown in FIG. 9 with the distance (B) equal to or greater than the distance $K_1$ (=D/sin$\theta_1$) in FIG. 5, i.e., with the bar material 3 fed in the negative direction until the end 5 thereof separates from the liquid surface 4, the bar material 3 is in the condition (a) of FIG. 2 at time $T_1$ in FIG. 9, supposing that the bar material 3 is in the condition (d) of FIG. 5 at time 0 in FIG. 9, and then, the bar material 3 fuses with the solution of the vacuum evaporation material 1 in the order of the condition (b) of FIG. 3, then condition (c) of FIG. 4, and the condition (d) of FIG. 5 with the elapse of time from time $T_1$ until time $T_2$ in FIG. 9. It is assumed that the speed pattern is set so that one cycle $T_S$ of the speed pattern is, for example, 1/10 of one cycle $T_L$ of the conventional art shown in FIG. 6. Then, the amount of the bar material 3 which fuses into the solution of the vacuum evaporation material 1 in one cycle can be made to be 1/10 of the amount which is conventionally used. The heat quantity to be absorbed by the end 5 from the liquid surface 4 becomes small with the reduction of the fusion amount of the bar material 3, so that the temperature reduction of the liquid surface 4 becomes small. Consequently, the reduction of the evaporation speed becomes small. The evaporation speed fluctuates in the cycle $T_S$ with the elapse of time as shown in FIG. 10. However, the fluctuation width Hs can be made to be approximately 1/10 of the width $H_L$ of the conventional art. Therefore, the uniformity of the film thickness can be improved in forming the film while the substrate is traveling.

Figure 7:
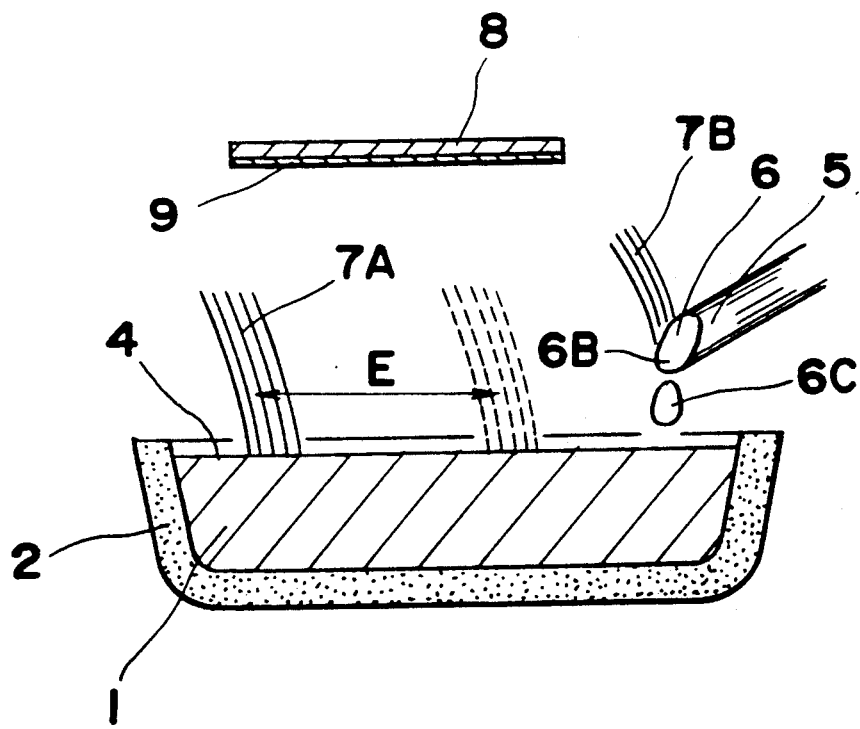
FIG. 7 is a schematic construction view, partly in section, showing third conventional method for supplying a vacuum evaporation material and an apparatus therefor.

If a bar material consists of a plurality of components whose evaporation speeds are different from each other, the supply amount (F−B) of the bar material 3 can be easily made to be Db/100∼Db/150 per reciprocation thereof because the movement of the bar material 3 in the feed distances (F) and (B) is controlled supposing that the diameter of the bar material is Db. In the third example of the known art shown in FIG. 7, as described previously, compared with the fact that the diameter of a droplet is in the range from Db/3 to Db/15, the vacuum evaporation material 1 can be supplied in a smaller amount by approximately one figure, so that the fluctuation of the composition ratio contained in vapor can be made to be small. As a result, the uniformity of the film thickness can be improved in forming the film while the substrate is traveling. p In the above example, the speed pattern is described using the trapezoidal waveform, however, the description of the speed pattern is not limited to that. A rectangular waveform, which simplifies a control, a sine wave of smooth acceleration and deceleration speeds, or any other waveform may be used. The cycle Ts may be determined so that the evaporation speed fluctuation width Hs which is decided by allowable film thickness fluctuation, becomes a required value. When the diameter of the bar material becomes great, the evaporation speed fluctuation width tends to become large because of the reason previously described, so that it is necessary to make the cycle Ts small.

In the above example, the description is made with the distance (B) equal to or greater than the distance $K_1$ ($=D/\sin\theta_1$) in FIG. 5, i.e., with the bar material 3 fed in the negative direction until the end 5 separates from the liquid surface 4. Additionally, it is possible to feed the end 5 of the bar material 3 in the negative direction until the condition (c) of FIG. 4, namely, until the condition in which the end 5 is connected with the liquid surface 4 through a narrowed solution 6. In this case, the distance (B) is equal to the distance ($K_2$).

By doing so, the period of time required for the condition (a) of FIG. 2 to become the condition (c) of FIG. 4 through the condition (b) of FIG. 3 is very short compared with that of the known art, so that the amount of the bar material 3 which fuses into the solution 6 in one cycle is much smaller compared with the known art. By doing so, the end 5 of the bar material 3 and the liquid surface 4 are always connected with each other through the solution 6. As a result, the vibration of the liquid surface 4 does not occur in feeding the bar material in the negative direction until the end 5 of the bar material 3 separates from the liquid surface 4, so that vacuum evaporation can be carried out in a stable condition.

Next, second, third, and fourth embodiments of the present invention applicable to a wider vacuum evaporation condition are described.

The second and third embodiments are effectively applied to the case in which thermal energy for heating the vacuum evaporation material 1 is great compared with the size of the crucible 2. In this condition, the vacuum evaporation material 1 becomes a solution, the temperature of which is fairly higher than its melting point. Then, when the bar material 3 comes into contact with the liquid surface 4, it is easy for the bar material 3 to fuse, so that the fusion amount becomes great and the amount of a supply material which fuses into a liquid surface as a result of its contact with the liquid surface exceeds the amount of the forward movement of the supply material in the operation per one positive direction movement and one negative direction movement, namely, per one reciprocation thereof. As a result, as described with reference to FIG. 11, the supply material does not come into contact with a liquid surface in an approximately equal amount for each reciprocation. Consequently, the vacuum evaporation speed fluctuates in a comparatively long cycle.

Figure 11:
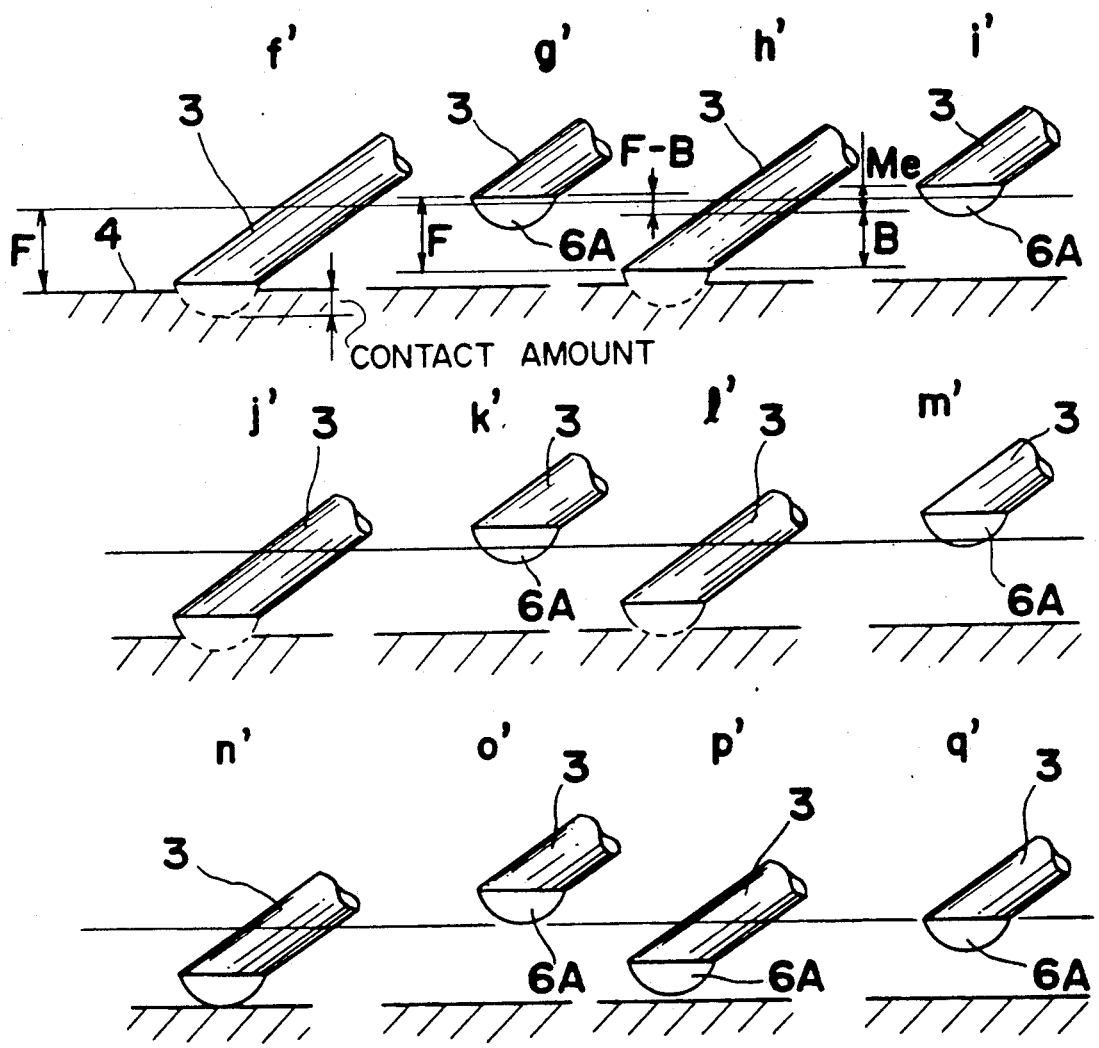
FIG. 11 is an enlarged view showing an end of the material and the liquid surface of the solution for describing second and third embodiments of the present invention.

FIG. 11 shows the fusion condition of the bar material 3 reciprocatingly supplied, in which an operation is repeated in the order of conditions f', g', h' ... p', q', f', g', h'. The conditions f', h', j', ... correspond to $T_1$ of FIG. 9, namely, the condition in which the bar material has completed its forward movement. The conditions g', i', k', correspond to $T_2$ of FIG. 9, namely, the condition in which the bar material has completed its backward movement. The condition changes from the condition of FIG. 2 to that of FIG. 5 when the bar material moves backward after the droplet 6A comes into contact with the liquid surface 4, i.e., when the bar material moves from the condition f' to the condition g' or from the condition h' to the condition i'. In order to make the description understandable, the bulge of the droplet 6A in FIG. 11 is larger than that shown in FIG. 5. Reference letter (Me) denotes the amount of the bar material 3 which fuses into the liquid surface 4 from the time when the bar material 3 comes into contact with the liquid surface 4 until the time when the ba material 3 separates from the liquid surface 4. As shown in FIG. 11, it is assumed that Me>(F−B), i.e., the amount of a supply material which fuses into a liquid surface as a result of its contact with the liquid surface exceeds the amount of the forward movement of the supply material in the operation of one positive direction movement and one negative direction movement, namely, one reciprocation. Since the bar material 3 repeats a reciprocating operation, the operations as shown in FIGS. 2 through 5 are repeated. Since Me>(F−B), the contact amount between the liquid surface 4 and the bar material 3 decreases gradually and finally, the bar material 3 does not come into contact with the liquid surface 4 as shown by the condition p'. When the contact amount is great, the fusion amount increases and the temperature of the liquid surface 4 lowers greatly, so that the evaporation speed becomes low. With the reduction of the contact amount, the fusion amount becomes smaller and the temperature rises, so that the problem arises in that the evaporation speed fluctuates as shown by an amplitude $H_A$ in the cycle of $T_A$ of FIG. 10. If the supply material is composed of a plurality of components whose evaporation speeds differ from each other, the supply material contains materials whose evaporation speed are high, more than those contained in the solution in the crucible, as described previously. Therefore, when the amount of the bar material which fuses into the liquid surface changes with the change of the contact amount between the bar material and the liquid surface as described previously, the composition ratio of vapor generated from the liquid surface changes, with the result that the composition ratio in the travel direction fluctuates when the film is formed while the substrate is traveling.

Figure 12:
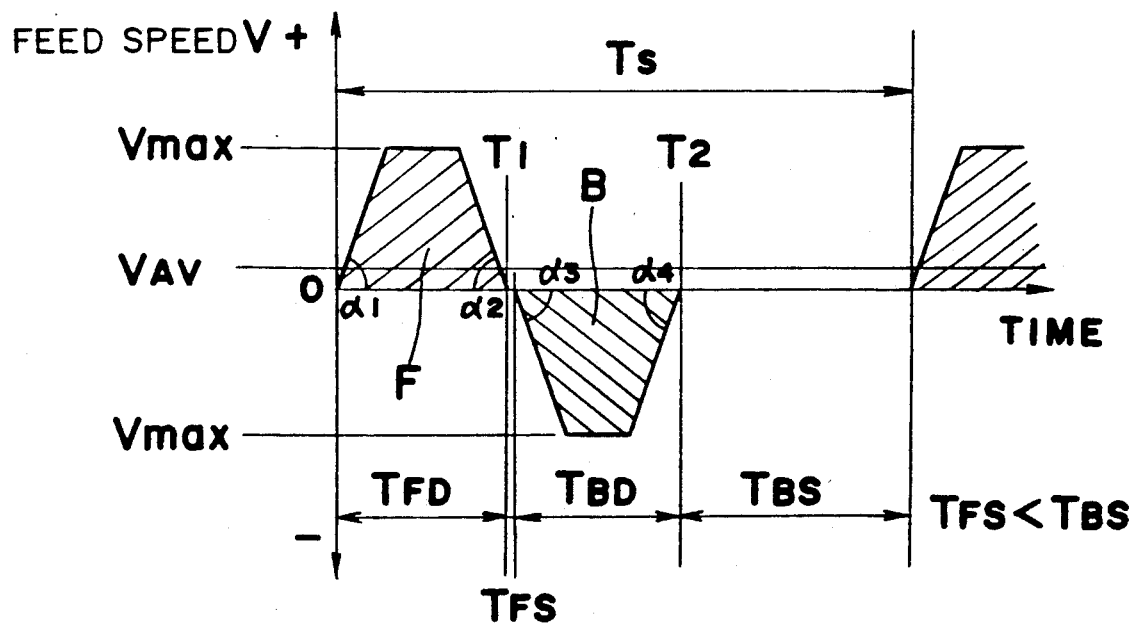
FIG. 12 shows a feed speed pattern of a bar material according to the second embodiment of the present invention.

FIG. 12 shows a feed speed pattern of the bar material 3 according to the second embodiment of the present invention, intended to solve this problem, and this feed speed pattern is characterized by $T_{BS} > T_{FS}$.

Since $T_{FS}$ is short, the contact period of time between the liquid surface and the bar material becomes short, so that the amount of the bar material which fuses into the liquid surface can be reduced when both are in contact with each other. On the other hand, since $T_{BS}$ is long, the denominator of the equation (1) becomes large, so that $(F-B)$ of the equation (1), namely, the supply amount per reciprocation of the bar material can be increased. Therefore, owing to the synergistic effect, the amount of the supply material which fuses into a liquid surface as a result of its contact with the liquid surface does not exceed the amount of the forward movement of the supply material in the operation in one positive direction movement and one negative direction movement, namely, per one reciprocation thereof. That is, the supply material comes into contact with the liquid surface in an approximately equal amount for each reciprocation, which can be satisfied. Therefore, the uniformities of a film thickness and composition ratio can be improved in forming the film while the substrate is traveling.

Figure 13:
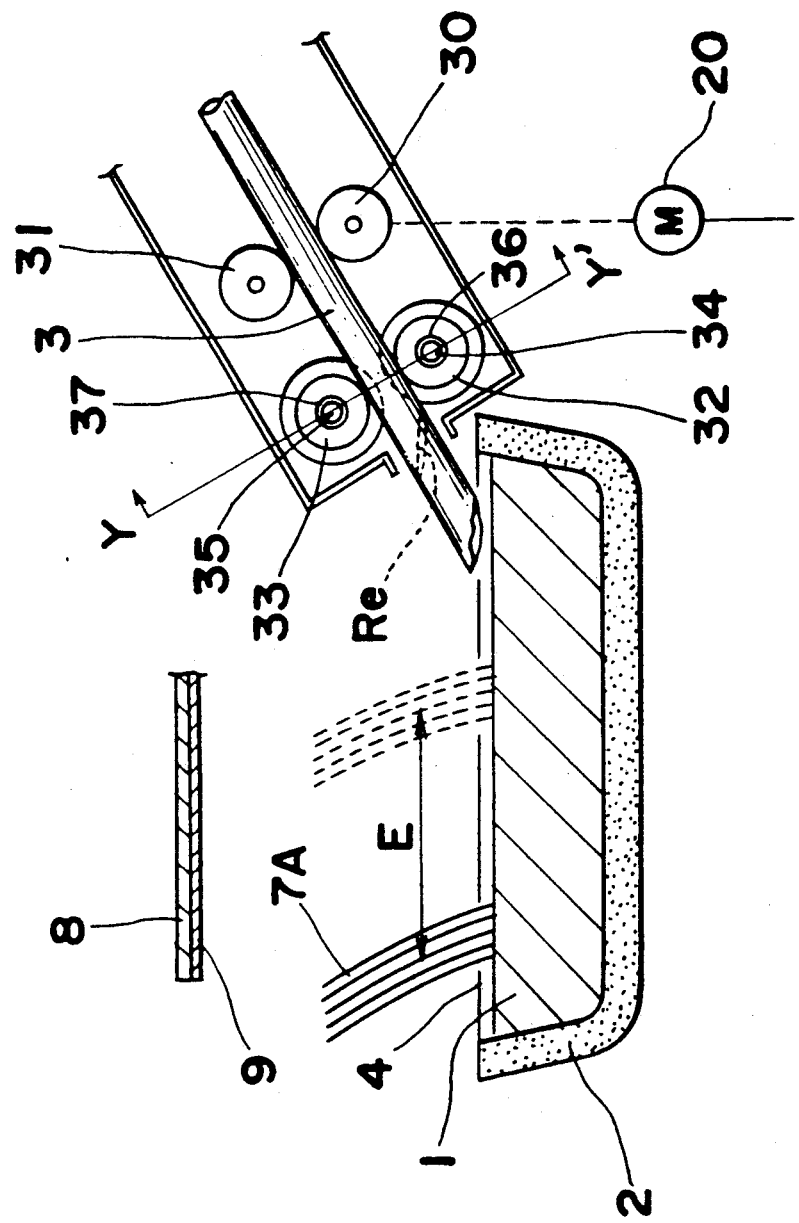
FIG. 13 is a schematic construction view, partly in section, showing an apparatus for supplying a vacuum evaporation material according to the third embodiment of the present invention.
Figure 14:
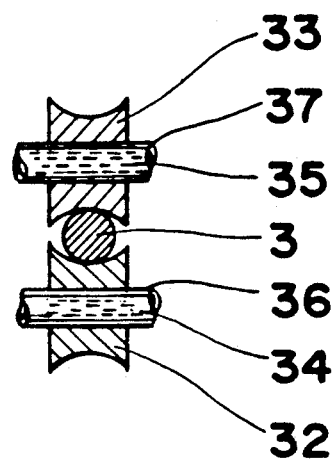
FIG. 14 is an enlarged view showing cooling rotation rollers and the material in FIG. 13.

FIGS. 13 and 14 are, respectively, the construction view and the enlarged view according to the third embodiment of the present invention, provided to solve this problem. The same parts of FIGS. 13 and 14 as those of FIG. 8 are denoted by the same reference numerals as those of FIG. 8. In FIGS. 13 and 14, reference numeral 30 denotes a driving roller driven by the motor 20, and 31 designates a rotation roller for guiding the bar material 3. Reference numerals 32 and 33 represent cooling rotation rollers rotatably supported by shafts 36 and 37 constructed around cooling fluid paths 34 and 35, respectively. Although not shown, the cooling rotation roller 33 is pressed against the cooling rotation roller 32 by a spring or its dead weight. The cooling rotation rollers 32 and 33 are drum-shaped so that they come into contact with the bar material 3 in a great area to increase their efficiency in cooling the bar material 3. Graphite or molybdenum disulfide is provided between the shaft 36 and the cooling rotation roller 32 and between the shaft 37 and the cooling rotation roller 33 for lubrication, as required.

According to the construction in FIG. 13, the bar material 3 moves away from the liquid surface 4 and the end 5 thereof stops at a position Re, so that the end 5 is cooled by the respective rotation rollers 32 and 33. As a result of the cooling, the bar material 3 is fed toward the liquid surface 4, and when it comes into contact with the liquid surface 4, it is hard for the temperature of the end 5 to rise, so that the amount of the end which fuses into the liquid surface 4 can be reduced. Accordingly, similarly to the second embodiment, the uniformities of a film thickness and composition ratio can be improved in forming the film while the substrate is traveling.

With the condition $T_{BS} > T_{FS}$ similar to the second embodiment, and when the suspension period of time of the bar material 3 being long after the bar material 3 moves away from liquid surface 4, the end 5 of the bar material 3 is sufficiently cooled by the cooling rotation rollers 32 and 33, so that the amount of the bar material 3 which fuses into the liquid surface 4 can be effectively reduced.

In the above example, two rotation rollers are used as the cooling members which come into contact with the bar material 3. However, one cooling rotation roller suffices if it has a sufficient cooling capacity. The cooling member is not necessarily rotated, and a fixed member cooled by water may be employed if there is no problem with the friction between the cooling member and the bar material 3.

The fourth embodiment is effective for the case in which, conversely to the second and third embodiments, heat energy for heating the vacuum evaporation material 1 is small compared with the size of the crucible 2, a cooled metal container made of such as Cu is used as the crucible 2 instead of ceramic, or the melting point of the vacuum evaporation material 1 is high. In such a condition, the vacuum evaporation material 1 consists of a solution whose temperature is not so high compared with its melting point. In this case, when the bar material 3 comes into contact with the liquid surface 4, the heat of the liquid surface 4 is absorbed by the bar material 3, so that the temperature of the liquid surface 4 rapidly lowers and the evaporation speed lowers noticeably.

FIG. 15 is the construction view of the fourth embodiment which solves this problem. In FIG. 15, reference numeral 7C denotes electron beams irradiated to the end 5 of the bar material 3. According to this construction, the bar material 3 moves away from the liquid surface 4 and the end 5 thereof stops at the position Re and the top end 5 is heated by the electron beams 7C.

With the rise of the temperature as a result of the heating, the bar material 3 is fed toward the liquid surface 4, thus coming into contact with the liquid surface 4, with the result that the end 5 does not absorb heat from the liquid surface 4 so much, and it is hard for the temperature of the liquid surface 4 to lower. Therefore, the lowering of the evaporation speed can be reduced. Accordingly, the uniformity of a film thickness can be improved in forming the film while the substrate is traveling. The fourth embodiment is effective as well if $T_{BS} > T_{FS}$, similar to the second embodiment.

Figure 16:
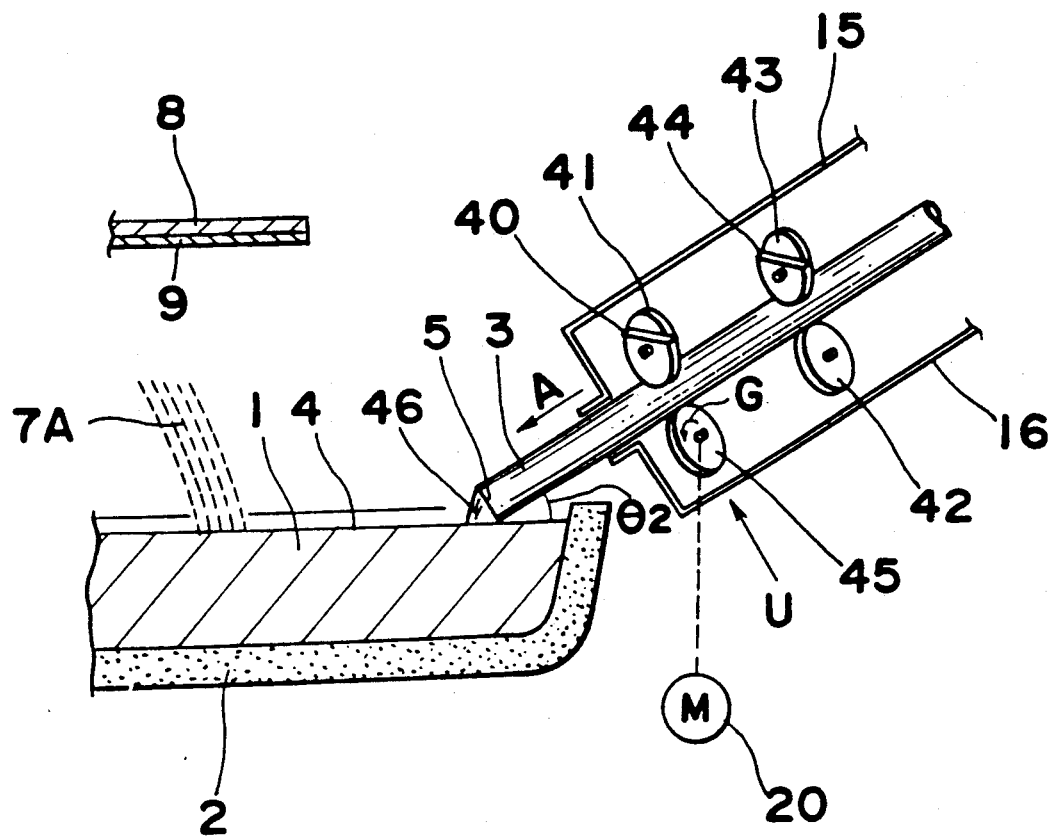
FIG. 16 is a schematic construction view, partly in section, showing a method for supplying a vacuum evaporation material according to a fifth embodiment of the present invention.
Figure 17:
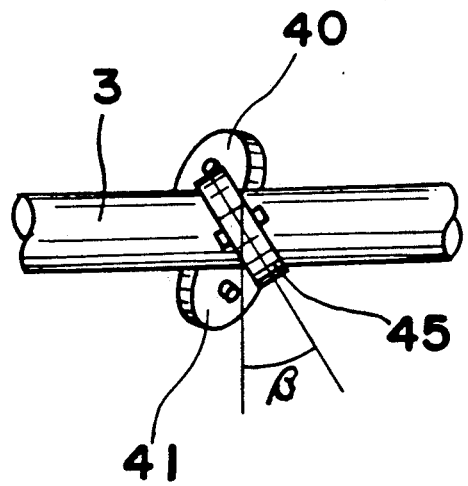
FIG. 17 is an enlarged fragmentary view taken in the direction of arrow (U) in FIG. 16.

Next, the fifth, sixth, and seventh embodiments of other driving methods of the present invention will be described. FIGS. 16 and 17 are, respectively, the construction view and the enlarged view according to the fifth embodiment of the present invention. In FIGS. 16 and 17, reference numerals 40, 41, 42, 43, and 44 denote rotation rollers for guiding the bar material 3 and 45 denotes a driving roller. The respective rollers come into contact with the bar material 3 at an intersection angle of $\beta$. In FIG. 16, the rotation rollers 40 and 41 are partly broken away to make the construction thereof understandable.

The driving roller 45 is driven by the motor 20 in the direction shown by the arrow (G) and the bar material 3 is sandwiched between the driving roller 45 and the rotation rollers 40 and 41, and the bar material 3 is fed in the direction shown by the arrow (A) at a constant speed toward the liquid surface 4 of the vacuum evaporation material 1, which has melted while the bar material 3 is rotating around its axis. Supposing that the diameter of the bar material 3 is Db, the feed amount of the bar material 3 per rotation thereof is $\pi \cdot Db \cdot \tan\beta$.

When the end 5 of the bar material 3 comes into contact with the liquid surface 4, it melts into a conical surface 46 as shown in FIG. 16, because the bar material 3 is rotating. The contact of the conical surface 6 with the liquid surface 4 is a line contact. In the conventional method shown in FIG. 1, since the bar material is not rotated, the end 5 thereof is flat and the contact with the liquid surface 4 is of a face contact. Since heat is transmitted from the liquid surface 4 to the end 5 less in the line contact than in the face contact, the amount of the fusion of the end 5 of the bar material 3 into the solution of the vacuum evaporation material 1 is less. Consequently, similar to the above description, the temperature lowering of the liquid surface 4 is small, so that the lowering of the evaporation speed is small. Thus, the uniformity of a film thickness can be improved.

Figure 18:
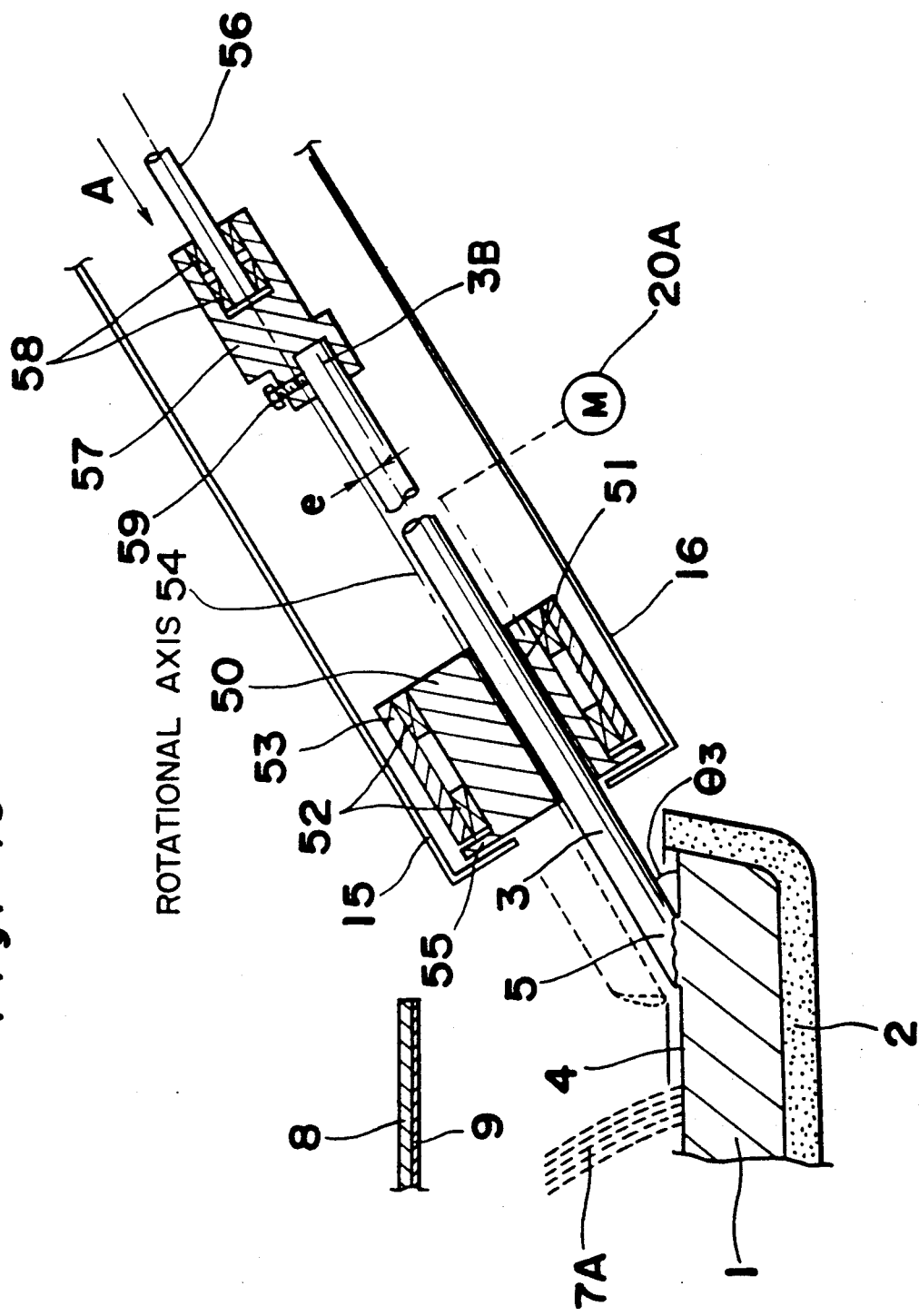
FIG. 18 is a schematic construction view, partly in section, showing a method for supplying a vacuum evaporation material according to a sixth embodiment of the present invention.

FIG. 18 is the construction view of the sixth embodiment of the present invention. In FIG. 18, reference numeral 50 denotes a rotation guide having an opening 51 for slidably guiding the bar material 3 in the lengthwise direction thereof, and the rotation guide 50 is supported by a bearing 52 and a bearing housing 53 and rotated by a motor 20A around a rotational axis 54. Reference numeral 55 denotes a flange for preventing vapor of the vacuum evaporation material 1 from permeating into the inside of the covers 15 and 16. Reference numeral 56 denotes a feed rod driven by a means (not shown) in the direction shown by the arrow (A) at a constant speed. Reference numeral 57 denotes a rotor rotatably supported by a bearing 58 which can receive both radial and thrust loads applied to the rod 56. The rear end 3B of the bar material 3 is fixed to the rotor 57 through a bolt 59.

Next, the operation of this construction will be described.

Figure 19:
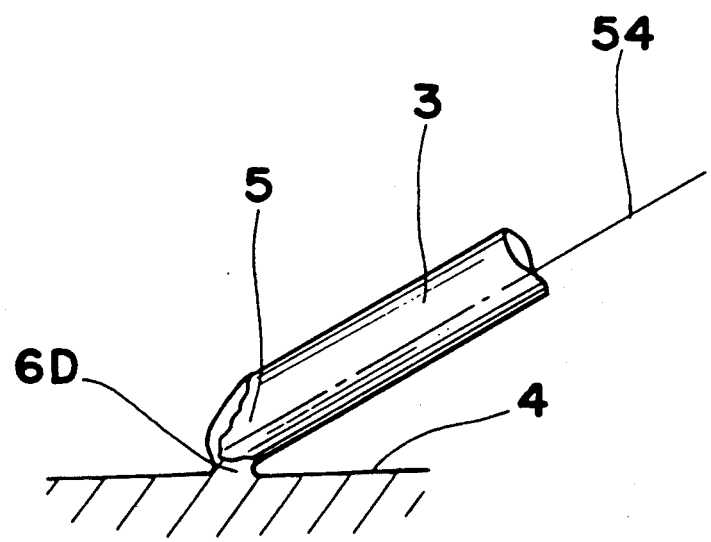
FIG. 19 is an enlarged view showing the end of the material and the liquid surface of the solution in FIG. 18.

Supposing that the bar material 3 is pressed by the rod 56 in the direction shown by the arrow (A) at a constant speed while the bar material 3 is rotated by the rotation guide 50, the end 5 of the bar material 3 makes a spiral motion. If the eccentric amount (e) of the bar material 3 from the rotation axis 54 is the radius of the bar material 3 or more, the end 5 of the bar material 3 separates from the liquid surface 4 when the bar material 3 is placed at a position shown by the broken lines after it makes a half rotation from a position shown by the solid lines of FIG. 18. If the eccentric amount (e) is the radius of the bar material 3 or less, the end 5 of the bar material 3 and the liquid surface 4 can be always connected with each other through a narrowed solution 6D as shown in FIG. 19. Therefore, this embodiment can perform material supply corresponding to the first embodiment, in which speed pattern of FIG. 9 is shown by a sine wave, $T_{FS} = T_{BS} = 0$, the cycle Ts is the rotation cycle of the rotation guide 50, and (F−B) is the feed amount of the rod 56 per rotation of the rotation guide. Accordingly, an advantage similar to that of the first embodiment can be obtained.

FIG. 20 is the construction view according to the seventh embodiment of the present invention. The same parts of FIG. 20 as those of FIG. 18 are denoted by the same reference numerals as those of FIG. 18. Reference numeral 60 denotes a self-aligning ball-and-roller bearing with its periphery fixed to an opening 72 of a rotation guide 70. The bar material 3 is slidably guided in the lengthwise direction thereof through the inner peripheral surface of an opening 61. Accordingly, no problems occur even if the rotation axis of the rotation guide 70 and the bar material 3 are not parallel with each other. Reference numeral 62 denotes a feed rod similar to the above-described feed rod 56. Reference numeral 63 denotes a mounting member constructed by fixing the rear end 3B of the bar material 3 by the bolt 59. Reference numeral 65 denotes a known universal coupling which couples, with a cross type pin 66, a two-pronged arm 67 of the rod 62 to a two-pronged arm 68 of the mounting member 63. The center point (X) of the cross type pin 66 is not necessarily provided in a prolonged line of the rotational axis of the rotation guide 70.

When the rotation guide 70 is rotated in this construction similarly to FIG. 18 and the rod 62 is driven in the direction shown by the arrow (A) at a constant speed, the bar material 3 is moved with respect to the center point (X) of the cross type pin 66 of the universal coupling 65 as the supporting point of its pivotal motion, and the end 5 makes a spiral motion with respect to a line 71, formed by connecting the point (X) with the rotational center point (Z) of the rotation guide 70 in the direction shown by the arrow (A) of the self-aligning ball-and-roller bearing 60, serving as the center. That is, the direction of the line 71 is the material supply direction. Accordingly, when the rotation guide 70 makes a half rotation from the position shown by the solid line of FIG. 20, the bar material 3 is placed at the position shown by the broken lines, and similar to the construction of FIG. 18, material supply corresponding to the first embodiment can be accomplished and a similar advantage can be obtained.

The differences among the fifth, sixth, and seventh embodiments are that the bar material 3 makes a rotation on its axis, makes both a rotation on its axis and a revolution on an axis, and makes a revolution on an axis, respectively. It is necessary in each of FIGS. 16, 18, and 20 that angles $\theta_2$, $\theta_3$, and $\theta_4$ are not 90°.

Figure 21:
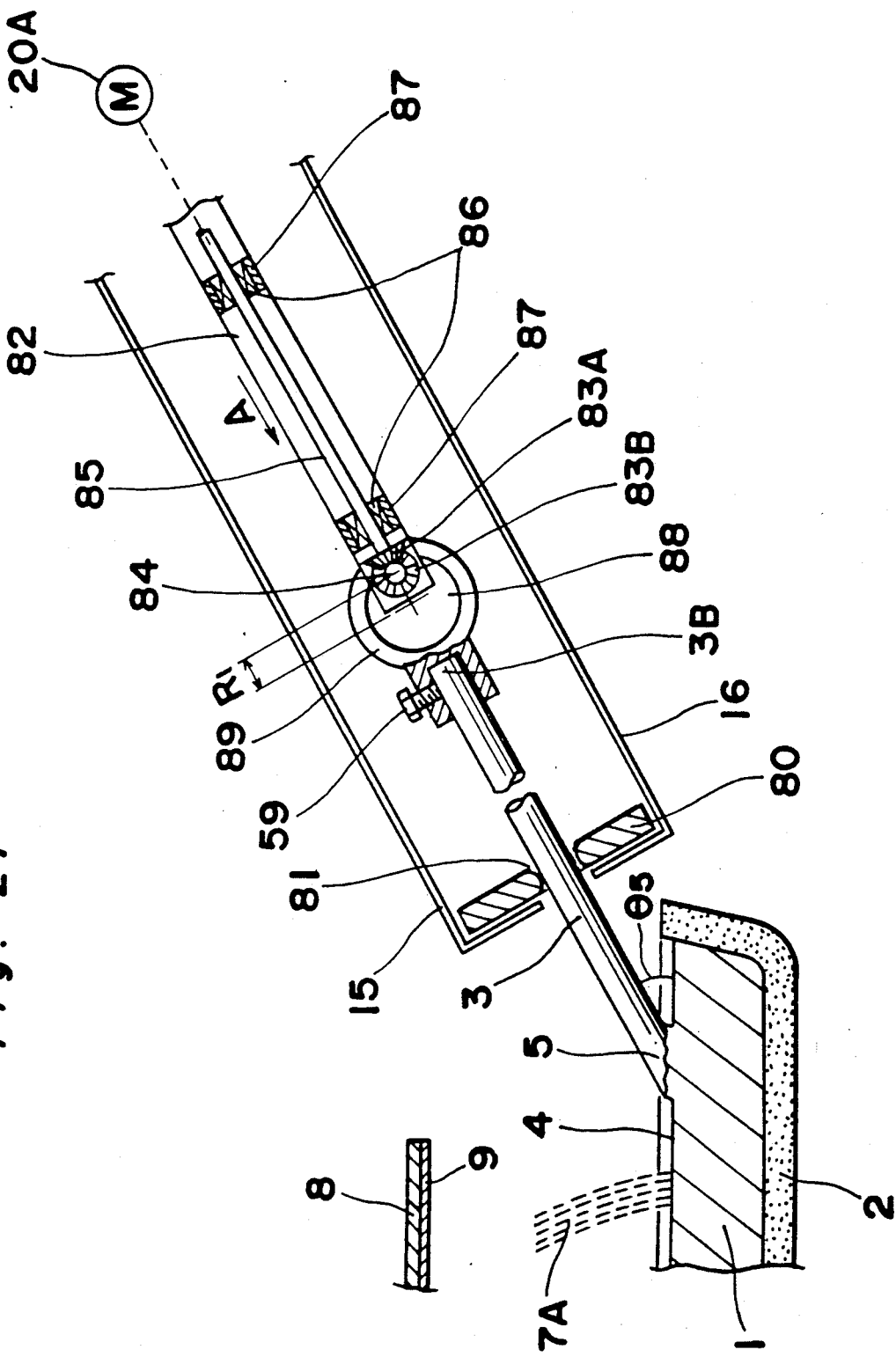
FIG. 21 is a schematic construction view, partly in section, showing a method for supplying a vacuum evaporation material according to an eighth embodiment of the present invention.

FIG. 21 is the construction view according to the eighth embodiment of the present invention. The same parts of FIG. 21 as those FIG. 18 are denoted by the same reference numerals as those of FIG. 18. In FIG. 21, reference numeral 80 denotes a guide member in which an opening 81, having a narrow part in the middle, is formed, thus guiding the bar material 3 through the opening 81. Reference numeral 82 denotes a feed rod similar to the above-described feed rod 56, and the end thereof rotatably supports a shaft 84 to which a bevel gear 83B is fixed. Reference numeral 85 denotes a shaft having a bevel gear 83A, which engages the bevel gear 83B, fixed to the end of the shaft 85. The shaft 85 is supported by a bearing 86 and rotated by the motor 20A. Reference numeral 87 denotes a bracket, formed on the feed rod 82, which supports the bearing 86. Reference numeral 88 denotes an eccentric ring which is fixed to the shaft 84 and rotates around the shaft 84, thus rotatably supporting a rotation ring 89 on the periphery thereof. Reference numeral 59 denotes the bolt for fixing the rear end 3B of the bar material 3 to the rotation ring 89. Accordingly, the shaft 84, the eccentric ring 88, the rotation ring 89, the bar material 3, and the opening 81 form a kind of crank mechanism, so that the bar material 3 is guided through the opening 81 by the rotation of the shaft 84, thus making a reciprocating motion at a stroke of $2 \cdot R_1$. Reference letter $R_1$ denotes the distance between the center of the shaft 84 and the center of the eccentric ring 88.

Next, the operation of this construction is described.

When the feed rod 82 is moved in the direction shown by the arrow (A) at a constant speed while the shaft 85 is being rotated by the motor 20A, the shaft 85 rotates the eccentric ring 88 through the bevel gears 83A and 83B and feeds the bar material 3 toward the liquid surface 4 while the bar material 3 is making a reciprocating motion. Accordingly, this construction can accomplish material supply corresponding to the first embodiment in which the speed pattern is shown by a sine wave in FIG. 9, and $T_{FS}=T_{BS}=0$. Therefore, an advantage similar to that of the first embodiment can be obtained. The feature of this embodiment is that it can be applied even if $\theta_5=90°$ unlike the fifth, sixth, and seventh embodiments.

In all of the above embodiments, the description is made supposing that the bar is cylindrical and the number thereof is one. However, the bar may be a material of a square pillar, a plate, or other configurations, providing that it is long, and the number of the bar material may be plural.

Instead of a driving roller, the bar material 3 or the feed rods 56, 62, and 82 may be fed by a chain, a belt or a rope which engage the bar material 3 or may be fed by a feed screw.

If the width (W) of the crucible 2 of FIG. 8 is large, uniform supply to the crucible 2 in the entire width thereof can be accomplished by providing the above-described supply means in a plurality of places. The fluctuations of the evaporation speed of bar materials and the composition thereof caused by the contact thereof with the liquid surface and the fusion thereof can be reduced by differentiating the timing of the contacts of respective bar materials with the liquid surface. Further, it is possible to carry out the first through eighth embodiments by appropriately combining them.

As described above, according to the method for supplying a vacuum evaporation material according to one aspect of the present invention, when the end of the vacuum evaporation material comes into contact with the liquid surface of the vacuum evaporation material after a supply material is fed in the positive direction, a fusion starts, and the bar is fed in the negative direction before the supply material fuses over a long period of time, with the result that the end of the supply material separates from the liquid surface or it is connected therewith through a narrowed solution. Thus, the supply material does not fuse into the solution in a large quantity. Therefore, since the temperature lowering of the liquid surface becomes small, the evaporation speed becomes also small. As a result, the reduction of a film thickness becomes small in forming the film while a substrate is traveling, so that the uniformity of the film thickness can be improved.

If the supply material consists of a plurality of components whose evaporation speeds differ from each other, compared with the known method, the supply material can be supplied in a smaller amount by approximately one figure, so that the fluctuation of the composition ratio contained in vapor can be made to be small. As a result, the uniformity of the composition ratio in the travel direction of the substrate in forming the film while the substrate is traveling can be improved.

According to the method for supplying a vacuum evaporation material as mentioned in still another aspect of the present invention, according to the above-described construction, if the temperature of the liquid surface of the vacuum evaporation material is high, the temperature of the end of the supply material is lowered by cooling the supply material in the vicinity of the top end thereof, so that it is difficult for the temperature of the supply material to rise when the supply material comes into contact with the liquid surface, and the amount of the supply material which fuses into the liquid surface can be reduced. Therefore, the amount of a supply material which fuses into a liquid surface as a result of its contact with the liquid surface does not exceed the amount of the forward movement of the supply material of the operation in one positive direction movement and one negative direction movement, i.e., one reciprocation. That is, the supply material comes into contact with the liquid surface in an approximately equal amount for each reciprocation. Therefore, the uniformities of a film thickness and composition ratio can be improved in forming the film while the substrate is traveling.

On the other hand, if the temperature of the liquid surface of the evaporation material is low, the temperature of the end of the supply material rises by heating the supply material in the vicinity of the end thereof, so that the end of the supply material does not absorb heat as much from the liquid surface when the supply material comes into contact with the liquid surface, and it is difficult for the temperature of the liquid surface to lower. Therefore, in the condition in which the reduction of the evaporation speed is small, the uniformity of a film thickness can be improved in forming the film while the substrate is traveling.

According to the apparatus for supplying a vacuum evaporation material as mentioned in the further aspect of the present invention, according to the above-described construction, when the supply material is rotated around its axis, the end of the supply material fuses into a conical configuration as a result of the contact of the top end thereof with the solution, and the supply material which comes into contact with the solution in a small area, so that the supply material is incapable of fusing into the solution in a great amount at a time. Accordingly, similar to one aspect of the present invention, since the reduction of the film thickness is small in forming the film while the substrate is traveling, the uniformity of the film thickness can be improved. Further, even if the supply material consists of a plurality of components whose evaporation speeds differ from each other, the uniformity of the composition ratio in the travel direction of the substrate in forming the film during the travel of the substrate can be improved.

When the supply material is rotated around an axis offset from the above-described axis by a predetermined distance, similar to one aspect of the present invention, supposing that the direction in which the supply material moves toward the vacuum evaporation material which has fused in a crucible is the positive direction and the direction in which the supply material moves backward therefrom is the negative direction, the supply material is fed in the positive direction on an average of the feed speed of the supply material by alternately switching the feed direction thereof between the positive direction and the negative direction. Accordingly, the advantage of one aspect of the present invention can be obtained.

According to the method for supplying a vacuum evaporation material as mentioned in a still further aspect of the present invention, according to the above-described construction, material supply similar to that of the further aspect of the present invention can be accomplished and similarly, and the advantage of the one aspect of the present invention can be obtained.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of supplying a vacuum evaporation material, comprising:
   heating a first vacuum evaporation material accommodated in a crucible to fuse the first vacuum evaporation material and generate vapor from the first vacuum evaporation material for the purpose of adhering the vapor in a thin film on a substrate, said first vacuum evaporation material forming a liquid surface; and
   feeding a second, elongated vacuum evaporation material at an average feed speed in a positive feed direction toward the liquid surface of said first vacuum evaporation material by alternately switching the feed direction between the positive feed direction and a negative feed direction;
   wherein the positive feed direction extends from above the liquid surface of said first vacuum evaporation material toward the liquid surface and the negative feed direction extends away from the liquid surface.

2. The method of supplying a vacuum evaporation material as claimed in claim 1, and further comprising the step of:
   performing the following calculation based on the desired average feed speed $V_{AV}$ for feeding the second vacuum evaporation material:

$$V_{AV} = (F-B)/(T_{FD} + T_{BD} + T_{FS} + T_{BS}).$$

wherein F is an incremental feed amount in the positive direction;
   B is an incremental feed amount in the negative direction, with $B > 0$,
   $T_{FD}$ is an incremental period of time for feed in the positive direction,
   $T_{FS}$ is a period of time of suspension in the positive direction feed, with $T_{FS} \geq 0$,
   $T_{BD}$ is an incremental period of time for feed in the negative direction,
   $T_{BS}$ is a period of time of suspension in the negative direction feed, with $T_{BS} \geq 0$;
   wherein the second, elongated vacuum evaporation material is fed at the average feed speed based on the values calculated above.

3. The method of supplying a vacuum evaporation material of claim 2, wherein $T_{BS} 22 T_{FS}$.

4. The method of supplying a vacuum evaporation material as claimed in claim 3, wherein in said step of performing the calculation, feed speed change in both the positive and negative directions is represented by a rectangular waveform having a maximum speed $V_{MAX}$, and based on the desired average feed speed $V_{AV}$, $T_{FD}$ is calculated according to the equation:

$$T_{FD} = T_{BD} + [(F-B)/V_{MAX}].$$

5. The method of supplying a vacuum evaporation material as claimed in claim 2, wherein in said step of performing the calculation, feed speed change in both the positive and negative directions is represented by a trapezoidal waveform having a maximum speed $V_{MAX}$, and based on the desired average feed speed $V_{AV}$, $T_{FD}$ is calculated according to the equation:

$$T_{FD} = T_{BD} + [(F-B)/V_{MAX}]$$

where both acceleration and deceleration are of the same magnitude.

6. The method of supplying a vacuum evaporation material as claimed in claim 2, wherein in said step of performing the calculation, feed speed change in both the positive and negative directions is represented by a trapezoidal waveform having a maximum speed $V_{MAX}$, and based on the desired average feed speed $V_{AV}$, $T_{FD}$ is calculated according to the equation:

$$T_{FD} = T_{BD} + [(F-B)/V_{MAX}]$$

where both acceleration and deceleration are of the same magnitude.

7. The method of supplying a vacuum evaporation material as claimed in claim 2, wherein in said step of performing the calculation, feed speed change in both the positive and negative directions is represented by a rectangular waveform having a maximum speed $V_{MAX}$, and based on the desired average feed speed $V_{AV}$, $T_{FD}$ is calculated according to the equation:

$$T_{FD} = T_{BD} + [(F-B)/V_{MAX}].$$

8. A method of supplying a vacuum evaporation material, comprising:
   providing a first vacuum evaporation material fused in a crucible;
   feeding a second, elongated vacuum evaporation material at an average feed speed in a positive feed direction toward a liquid surface of said first vacuum evaporation material by alternately switching the feed direction between the positive feed direction and a negative feed direction;
   wherein the positive feed direction extends from above the liquid surface of said first vacuum evaporation material toward the liquid surface and the negative feed direction extends away from the liquid surface; and
   changing the temperature of an end of the second, elongated vacuum evaporation material being fed toward the liquid surface.

9. The method of claim 8, wherein in said step of changing the temperature of an end of the second, elongated vacuum evaporation material, the end of the second material is cooled.

10. The method of supplying a vacuum evaporation material as claimed in claim 9, and further comprising the step of:
    performing the following calculation based on the desired average feed speed $V_{AV}$ for feeding the second vacuum evaporation material:

$$V_{AV} = (F-B)/(T_{FD} + T_{BD} + T_{FS} + T_{BS}),$$

wherein F is an incremental feed amount in the positive direction;
    B is an incremental feed amount in the negative direction, with $B > 0$,
    $T_{FD}$ is an incremental period of time for feed in the positive direction,
    $T_{FS}$ is a period of time of suspension in the positive direction feed, with $T_{FS} \geq 0$, $T_{BD}$ is an incremental period of time for feed in the negative direction, $T_{BS}$ is a period of time of suspension in the negative direction feed, with $T_{BS} \geq 0$;

wherein the second, elongated vacuum evaporation material is fed at the average feed speed based on the values calculated above.

11. The method of claim 8, wherein in said step of changing the temperature of an end of the second, elongated vacuum evaporation material, the end of the second material is heated.

12. The method of supplying a vacuum evaporation material as claimed in claim 11, and further comprising the step of:

performing the following calculation based on the desired average feed speed $V_{AV}$ for feeding the second vacuum evaporation material:

$$V_{AV} = (F - B)/(T_{FD} + T_{BD} + T_{FS} + T_{BS}).$$

wherein F is an incremental feed amount in the positive direction;

B is an incremental feed amount in the negative direction, with $B > 0$, $T_{FD}$ is an incremental period of time for feed in the positive direction, $T_{FS}$ is a period of time of suspension in the positive direction feed, with $T_{FS} \geq 0$, $T_{BD}$ is an incremental period of time for feed in the negative direction, $T_{BS}$ is a period of time of suspension in the negative direction feed, with $T_{BS} \geq 0$;

wherein the second, elongated vacuum evaporation material is fed at the average feed speed based on the values calculated above.

13. The method of supplying a vacuum evaporation material as claimed in claim 8, and further comprising the step of:

performing the following calculation based on the desired average feed speed $V_{AV}$ for feeding the second vacuum evaporation material:

$$V_{AV} = (F - B)/(T_{FD} + T_{BD} + T_{FS} + T_{BS}).$$

wherein F is an incremental feed amount in the positive direction;

B is an incremental feed amount in the negative direction, with $B > 0$, $T_{FD}$ is an incremental period of time for feed in the positive direction, $T_{FS}$ is a period of time of suspension in the positive direction feed, with $T_{FS} \geq 0$, $T_{BD}$ is an incremental period of time for feed in the negative direction, $T_{BS}$ is a period of time of suspension in the negative direction feed, with $T_{BS} \geq 0$;

wherein the second, elongated vacuum evaporation material is fed at the average feed speed based on the values calculated above.

14. A method of supplying a vacuum evaporation material, comprising:

heating a first vacuum evaporation material in a crucible to melt the first material, form a liquid surface and generate vapor for adhesion in a thin film on a substrate; and feeding a second, elongated vacuum evaporation material, having a longitudinal axis, in a feed direction from above the liquid surface toward the liquid surface at an oblique angle while the second, elongated vacuum evaporation material is rotated about said longitudinal axis thereof.

15. A method of supplying a vacuum evaporation material, comprising:

heating a first vacuum evaporation material in a crucible to melt the first material, form a liquid surface and generate vapor for adhesion in a thin film on a substrate; and feeding a second, elongated vacuum evaporation material, having a longitudinal axis, in a feed direction from above the liquid surface toward the liquid surface at an oblique angle while the second, elongated vacuum evaporation material is rotated about an axis offset a predetermined distance from said longitudinal axis.

16. A method of supplying a vacuum evaporation material, comprising:

heating a first vacuum evaporation material in a crucible to melt the first material, form a liquid surface and generate vapor for adhesion in a thin film on a substrate; and feeding a second, elongated vacuum evaporation material in a feed direction from above the liquid surface toward the liquid surface in a reciprocatory manner, by providing a crank mechanism, connecting the second, elongated vacuum evaporation material to the crank mechanism and feeding the crank mechanism toward the liquid surface of the first vacuum evaporation material while operating the crank mechanism to cause a reciprocatory motion of the second material toward and away from the first material in said crucible.

* * * * *